United States Patent
Maldei et al.

(10) Patent No.: US 6,909,152 B2
(45) Date of Patent: Jun. 21, 2005

(54) HIGH DENSITY DRAM WITH REDUCED PERIPHERAL DEVICE AREA AND METHOD OF MANUFACTURE

(75) Inventors: Michael Maldei, Durham, NC (US); Brian Cousineau, Burlington, NC (US); Guenter Gerstmeier, Chapel Hill, NC (US); Jon S. Berry, II, Durham, NC (US); Steven M. Baker, Morrisville, NC (US); Jinhwan Lee, Raleigh, NC (US)

(73) Assignee: Infineon Technologies, AG, Munich (DE)

( * ) Notice: Subject to any disclaimer, the term of this patent is extended or adjusted under 35 U.S.C. 154(b) by 18 days.

(21) Appl. No.: 10/294,329

(22) Filed: Nov. 14, 2002

(65) Prior Publication Data

US 2004/0094810 A1 May 20, 2004

(51) Int. Cl.[7] .......................... H01L 29/40; H01L 29/78
(52) U.S. Cl. ..................................... 257/382; 257/508
(58) Field of Search ................................. 257/296–313, 257/368, 379, 382, 508, 750–766, 905–908

(56) References Cited

U.S. PATENT DOCUMENTS

| | | | |
|---|---|---|---|
| 5,956,594 A | * | 9/1999 | Yang et al. ............... 438/396 |
| 6,074,912 A | | 6/2000 | Lin et al. |
| 6,207,513 B1 | | 3/2001 | Vollrath |
| 6,235,574 B1 | | 5/2001 | Tobben et al. |
| 6,245,629 B1 | | 6/2001 | Tobben |
| 6,255,684 B1 | | 7/2001 | Roesner et al. |
| 6,274,425 B1 | * | 8/2001 | Park ......................... 438/241 |
| 6,281,084 B1 | | 8/2001 | Akatsu et al. |
| 6,310,396 B1 | | 10/2001 | Kanitz |

OTHER PUBLICATIONS

Peter Van Zant; Microchip Fabrication : a practical guide to semiconductor processing; 2000; McGraw Hill, New York; 4th edition; pp. 154–156, 391–392.*

* cited by examiner

Primary Examiner—Howard Weiss
Assistant Examiner—Marcos D. Pizarro-Crespo
(74) Attorney, Agent, or Firm—Brinks Hofer Gilson & Lione

(57) ABSTRACT

A dynamic random access memory (DRAM) structure having a distance less than 0.14 μm between the contacts to silicon and the gate conductor is disclosed. In addition a method for forming the structure is disclosed, which includes forming the DRAM array contacts and the contacts to silicon simultaneously.

9 Claims, 4 Drawing Sheets

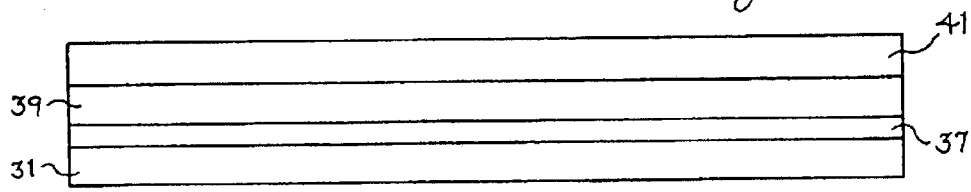
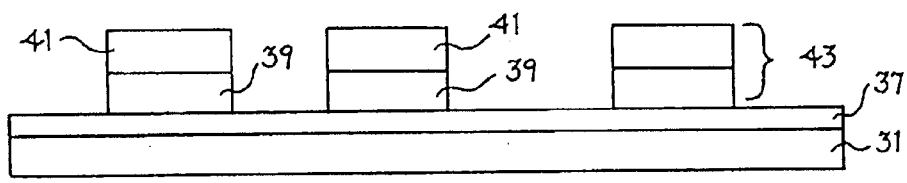
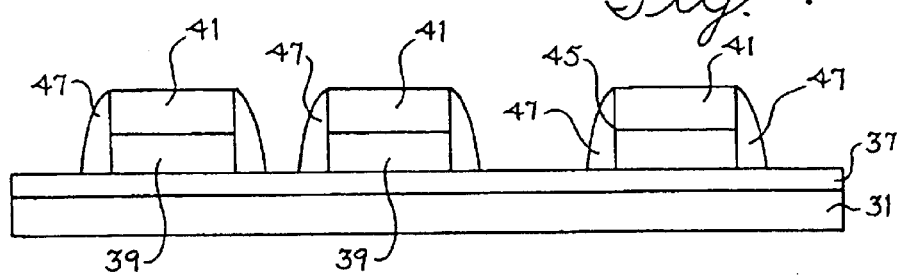
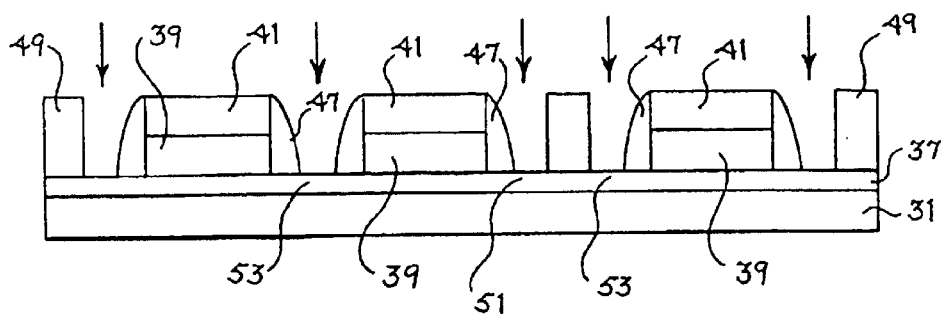

HIGH DENSITY DRAM WITH REDUCED PERIPHERAL DEVICE AREA AND METHOD OF MANUFACTURE

FIELD OF THE INVENTION

This invention relates to dynamic random access memory (DRAM) structures, and more particularly, to high density DRAMs with reduced peripheral device area and a method of manufacturing the same.

BACKGROUND

Presently a state-of-the art DRAM comprises a substrate with an array of memory cells, including transistors, that are arranged in rows and columns and connected by wordlines and bitlines and a peripheral device area with support circuitry, including transistors, for reading in and out binary digits (bits) stored in the memory cells. Typically, array transistors are all the same and are packed very densely in the array while peripheral transistors differ in size and are spaced further apart. Continued demand to shrink electronic devices has facilitated the design of DRAMs having greater density and smaller size. However, current manufacturing methods limit the size of the array and support circuitry components.

FIGS. 1 and 2 illustrate a prior art peripheral metal oxide semiconductor (MOS) transistor 1 in 0.14 $\mu$m groundrule. The MOS transistor is formed on a silicon substrate 3 and comprises a thin gate oxide layer 5 on the substrate. Typically, the gate oxide layer is silicon oxide and has a thickness of about 50 A. The MOS transistor further comprises a gate conductor 7, a gate cap insulator 9, two spacers 11, a dielectric layer 13, and a layer of silicon dioxide 15. Spaced apart and on either side of the gate conductor are periphery contact-to-diffusion (CD) openings or CD contacts 17, which form a source and a drain for the MOS transistor 1. The terms "drain" and "source" are used herein interchangeably to refer to the diffusion regions. The CD contacts are interconnected separately for the source and the drain by conductive metalization lines 19. In addition to the CD contacts, a contact-to-gate (CG) opening or CG contact 21 forms a contact to the gate conductor 7.

As shown in FIG. 2, the separation 23 between the CD contacts 17 and the gate conductor 7 is 0.14 $\mu$m, and the separation 25 between the metalization lines is 0.38 $\mu$m. The distance between the metalization lines, which includes the width of the gate conductor and the width of the CD contacts, determines the overall width of the transistor. The overall width 27 of the prior art MOS transistor in FIG. 2 is 0.94 $\mu$m.

During current manufacturing processes for DRAMs, the CD contacts 17 and the CG contacts 21 are patterned on the same photoresist mask, and then etched at the same time. A non-selective etching process is used to etch the CD and CG contacts because the contacts need to be etched through a thick layer of gate cap insulator 9 which is usually silicon nitride. The spacing between the gate conductor 7 and the CD contacts 17 must be at least 0.14 $\mu$m because a non-selective etch process is used. If the CD contacts 17 are closer than 0.14 $\mu$m to the gate conductor 7, the non-selective etching process may etch into the gate conductor if there is mask overlay shift and cause a short in the path. Because a minimum distance of 0.14 $\mu$m must be maintained, a limit is placed on the number of MOS transistors that will fit in a given area on a silicon wafer. Therefore, it would be advantageous to reduce the size or width of the MOS transistor in order to permit a higher number of MOS transistors to be placed on the periphery of the DRAM device.

BRIEF SUMMARY OF THE INVENTION

In accordance with one aspect of the invention, a method is provided for forming a semiconductor structure. The method includes: providing a substrate, forming a gate oxide layer on the substrate, depositing a gate conductor layer over the gate oxide; depositing a gate cap insulator over the gate conductor; etching a gate stack having sidewalls from the gate conductor and the gate cap insulator, forming spacers on the gate stack sidewalls; implanting at least one source and one drain; depositing a first insulating layer over the substrate; depositing a second dielectric layer over the substrate, forming at least one borderless array contact (CB) and at least one peripheral contact-to-diffusion simultaneously using a selective etching process; and etching at least one gate contact.

In accordance with another aspect of the present invention, metallization trenches are formed after etching the gate contact. Subsequently, the metallization trenches, borderless array contact, peripheral contact-to-diffusion, and the gate contact are filled with a conductive material to form a semiconductor device.

In yet another aspect of the present invention a semiconductor structure is disclosed. The structure comprises a substrate having an array region and a support region. Gate stacks having a gate conductor, a gate cap, and sidewall spacers are positioned on the substrate. A first layer of dielectric material covers the gate stacks and substrate, and a second layer of dielectric material covers the first dielectric layer. Peripheral contacts-to-diffusion extend from the second dielectric layer to the substrate, and borderless array contacts extend from the insulating layer to the gate conductor. The peripheral contacts-to-diffusion and borderless array contacts are formed using the same photoresist mask and etched using a process which is nonselective to the gate cap and spacers.

One advantage of the present invention is that the peripheral transistor area that is necessary for mask layout is decreased.

Another advantage of the present invention is that the overall width of the peripheral transistor is significantly reduced, so that the transistor occupies less area on the silicon wafer. As a result, more DRAMs can be printed on a given wafer area.

A further advantage of the present invention is that the overall width of the peripheral transistors is reduced without adding any additional manufacturing steps.

Additional objects and advantages of the invention will become apparent from the following description and the appended claims when considered in conjunction with the accompanying drawings.

BRIEF DESCRIPTION OF SEVERAL VIEWS OF THE DRAWINGS

FIGS. 3–12 are cross-sections of a portion of a substrate, at various stages of manufacture, on which MOS transistors suitable for DRAM memory array cells and peripheral circuitry are formed;

It should be appreciated that for simplicity and clarity of illustration, elements shown in the Figures have not necessarily been drawn to scale. For example, dimensions of some of the elements are exaggerated relative to each other for clarity.

DETAILED DESCRIPTION OF THE INVENTION

As is known in the manufacture of silicon integrated circuits, it is conventional to do the processing on a relatively large silicon wafer after which the wafer is diced into individual silicon chips, which include the desired integrated circuit. For convenience, the description of the method of the present invention will be primarily in terms of a single chip, which is formed into a single DRAM. However, it should be appreciated that the method is equally applicable to wide scale production of large silicon wafers.

Figure 1:
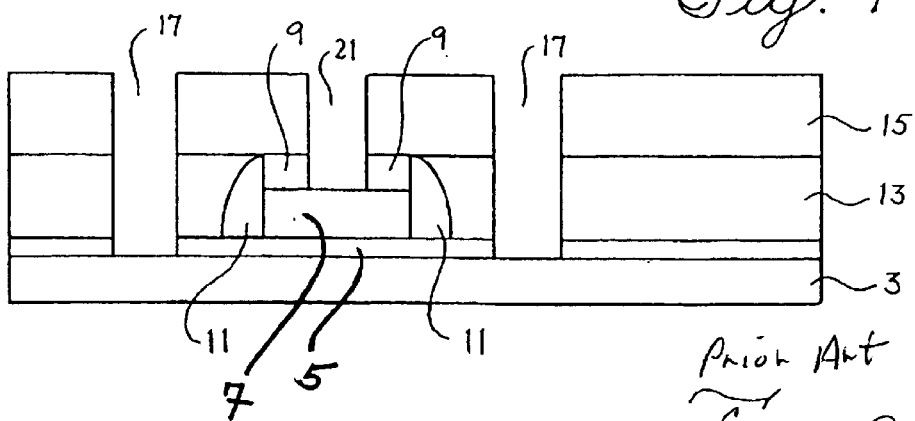
FIG. 1 is cross-section of a prior art MOS transistor used in the peripheral circuitry for a DRAM device.
Figure 2:
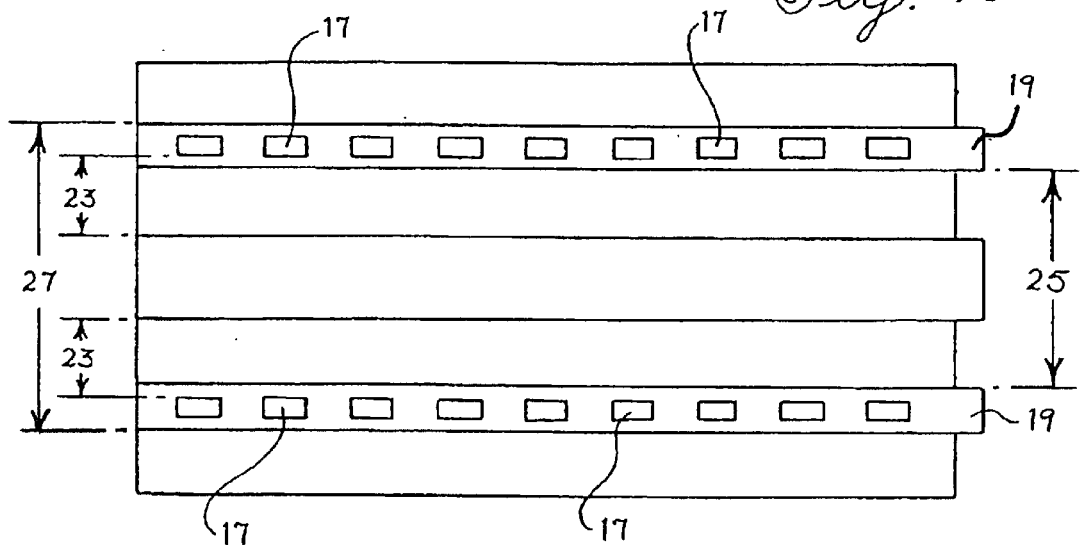
FIG. 2 is a top view of a prior art MOS transistor used in the peripheral circuitry for a DRAM device.
Figure 3:
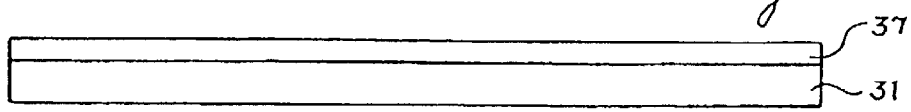

FIG. 3 shows a portion of a substrate 31, which comprises an array portion where N-MOSFETs are formed for the memory cells of a DRAM, and a periphery portion where N-MOSFETs and P-MOSFETS are formed for the support circuitry of the DRAM. Typically, the support circuitry is concentrated in regions that border the area where the memory cells are concentrated. The substrate 31 may be monocrystalline silicon or any other suitable semiconductor substrate material.

Figure 4:
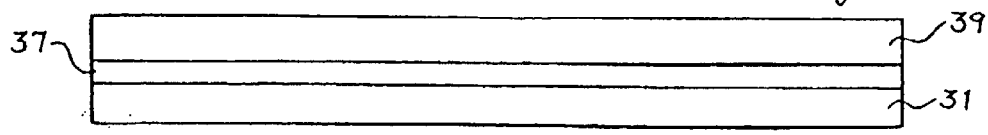

Initially, a masking layer of suitable photoresist (not shown) is deposited on the substrate and patterned. The substrate is subjected to ion implantation to form transistor wells. The masking layer is stripped and a gate oxide layer 37 is grown over the entire surface of the crystalline substrate 31 as shown in FIG. 3. Subsequently, a gate conductor 39 is then deposited on the gate oxide layer 37 as shown in FIG. 4. The gate conductor 39 may be undoped polysilicon, doped polysilicon and/or polycide, although other suitable conductors, including metal may also be used. In one embodiment, the gate conductor 39 is formed by depositing a bottom layer of polysilicon on the gate oxide 37 layer and then depositing a layer of tungsten silicide (WSi) over the polysilicon layer by either sputtering or chemical vapor deposition (CVD). The bottom layer of polysilicon improves the adhesion of the tungsten silicide to the gate oxide layer. The polysilicon layer may be doped in order to improve its conductivity. However, depending on the desired threshold voltage for the device, the doping concentration may or may not be uniform with respect to the depth of the polysilicon layer. A gate cap insulator layer 41 is then deposited over the gate conductor layer 39 as shown in FIG. 5. The gate cap insulator layer may be silicon nitride, silicon dioxide, doped silicon dioxide, or any other suitable material.

Next, a layer of suitable photoresist (not shown) is deposited over the gate cap insulator 41 and patterned to form the gate stack mask. Subsequently, gate stacks 43 comprising gate conductor 39 and gate cap insulator 41 are etched. In one embodiment, the gate stacks 41 are etched using a standard reactive ion etching (RIE) process utilizing standard chemistries, including but not limited to, carbon monoxide, nitrogen, oxygen, Argon, $C_4F_8$, $CH_2F_2$, and $CHF_3$. However, other suitable directional etching processes well-known in the art of semiconductor processing may also be used.

After the gate stacks 43 are etched, the mask is stripped and gate spacers 47 are created on sidewalls 45 of the gate stacks. A uniform layer of insulating material is deposited by CVD, or by any other suitable method, on the gate stacks 43 and the gate oxide layer 37. In other words, the vertical thickness of the insulating material on the gate oxide layer 37 is the same as the horizontal thickness of the insulating layer on the sides of the gate stacks 43. However, the vertical thickness of the insulating layer on the sides of the gate stacks 43 is generally the same as the height of the gate stacks 43. As a result, when the substrate is subjected to a vertical directional etching process, the top of the gate stack and substrate will be etched away first leaving some insulating material on the sidewalls 45 of the gate stacks which are the gate spacers 47. In one embodiment, the spacers are formed from silicon nitride and etched using an anisotropic process such as a standard RIE etching process. However, other insulating materials and etching processes well-known in the art may also be used.

Once the spacers are formed, a source/drain implant mask 49 is deposited and patterned, and the source 51 and drain 53 are formed by ion implantation as shown by the arrows in FIG. 8. The remaining source/drain mask is stripped, and a first dielectric layer 55 is deposited on the substrate. The first dielectric layer includes, but is not limited to borophosphosilicate insulating glass (BPSG), phosphosilicate insulating glass (PSG), FSG, F-BSG, and ASG. In one embodiment, the first insulating layer is BPSG which may be deposited by a variety of methods including but not limited to, CVD, low pressure CVD, or plasma enhanced chemical vapor deposition (PECVD). Thermal reflow is used to fill the gaps so that a smooth contoured surface is formed over the substrate. In order to improve the reflow, the BPSG may have a relatively high amount of boron or phosphorous to accommodate the reflow-temperature of small geometry devices. However, the BPSG layer still roughly conforms to the underlying device features on the substrate, and therefore, is non-planar. The surface 57 of the BPSG glass is planarized by chemical mechanical polishing (CMP).

Figure 9:
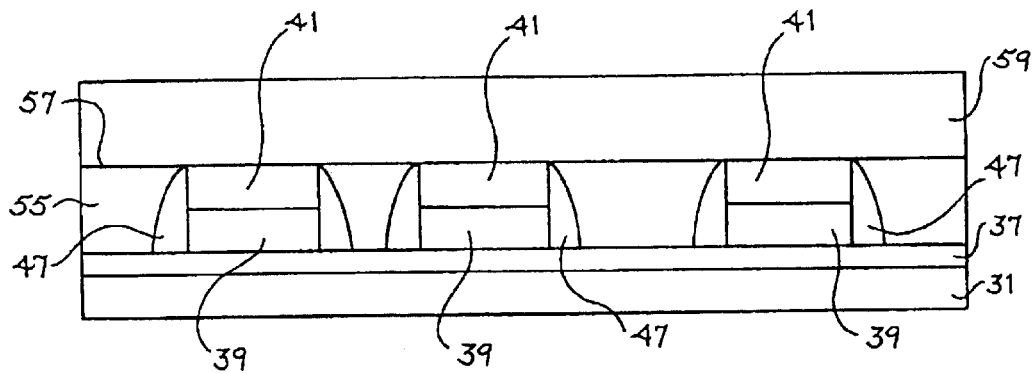
Figure 10:
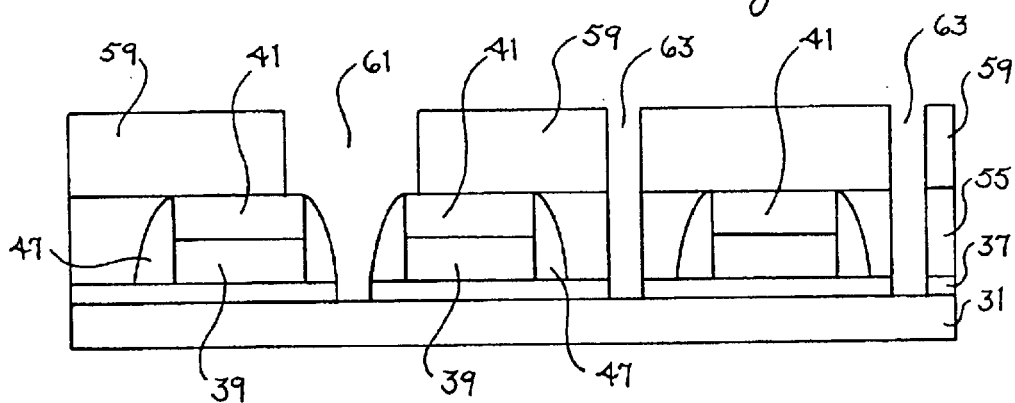

Subsequently, a second dielectric layer 59 is deposited on the first dielectric layer. This dielectric layer may be tetra-ethylorthosilicate (TEOS), silicon dioxide, or any other suitable insulating material as shown in FIG. 9. A DRAM array contact mask (not shown) is deposited on the TEOS layer and patterned by standard lithography. The DRAM array contacts 61, which are borderless contacts, and the periphery CD contacts 63 are then etched using an etching process selective to the material of the gate cap insulator 41 and spacers 47 as shown in FIG. 10. The DRAM array contacts 61 and the peripheral CD 63 contacts can be etched at the same time because they are etched through similar materials.

Figure 11:
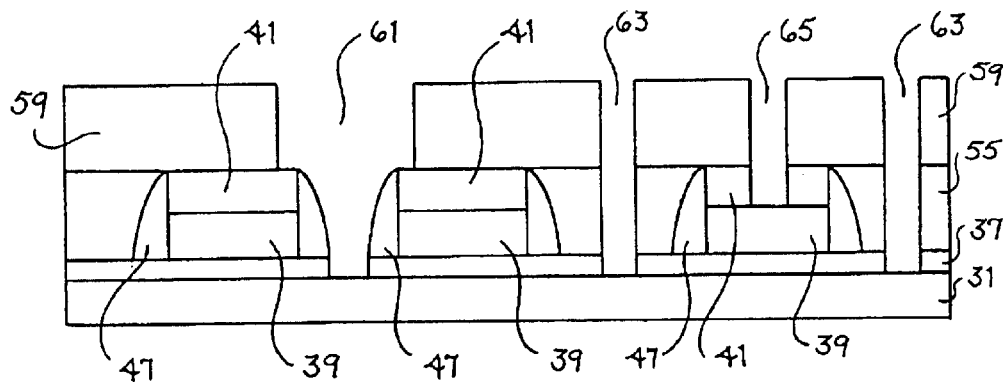

In one embodiment, the gate cap insulator 41 and spacers 47 are silicon nitride and the etch is an RIE process selective to silicon nitride. Thus, when the gate array contacts and the CD contacts are etched, the RIE process will not etch through silicon nitride gate spacers 47 and gate conductor 7 and cause a short in the gate path if the mask is misaligned. Even in a case of severe misalignment of the DRAM array CB contact mask, the CD contacts are not etched into the gate cap insulator or gate spacers. As a result, the CD contacts may be placed closer to the gate conductor without risking etch-out of the gate conductor thereby reducing the overall width of the MOS transistor. Thereafter, the DRAM array contact mask is stripped, and a DRAM peripheral contact mask (not shown) is deposited on the structure. The mask is patterned using standard lithography, and the silicon oxide layer and the gate cap insulator layer are etched using a non-selective etching process to form the CG contacts as shown in FIG. 11. In one embodiment, a standard non-selective RIE etch is used to etch the CG contacts.

Figure 12:
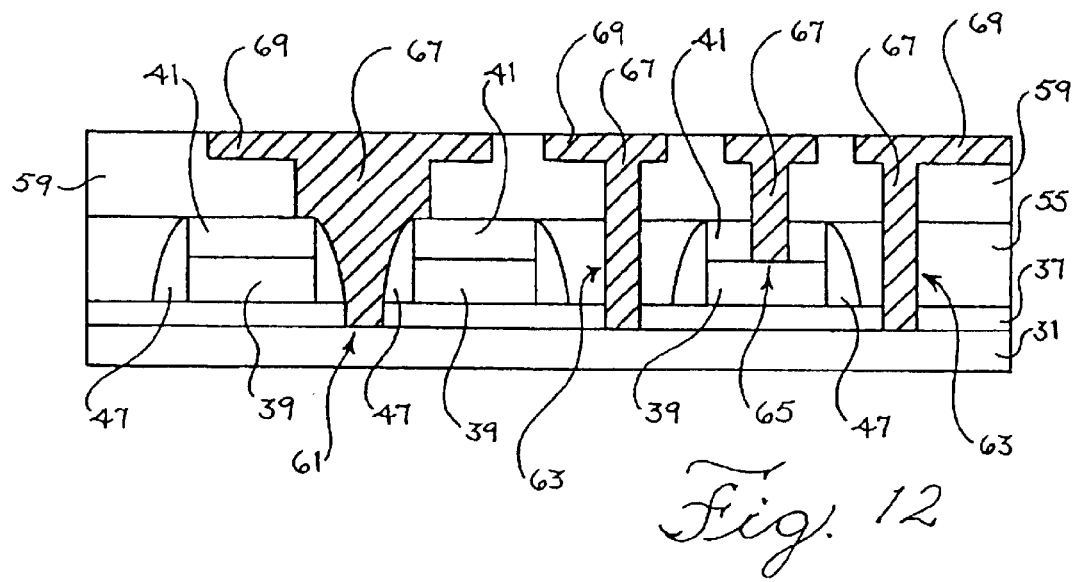

The DRAM peripheral contact mask is then stripped, and a line mask (not shown) for the first metalization layer is deposited on the structure. The mask is patterned using standard lithography, and first metalization trenches are etched into the silicon oxide layer. In one embodiment, a RIE process is used to etch the first metalization trenches. The remaining mask is then stripped, and a conductor 67 is deposited on the structure, filling in the array CB contacts 61, the CD contacts 63, and the CG contacts 65, and first metalization trenches 69 as shown in FIG. 12. The first metalization trenches are then planarized to the silicon oxide surface by a CMP process. The conductor may be tungsten, aluminum, aluminum-copper alloy, copper, tantalum, or any other suitable conductive material.

Figure 13:
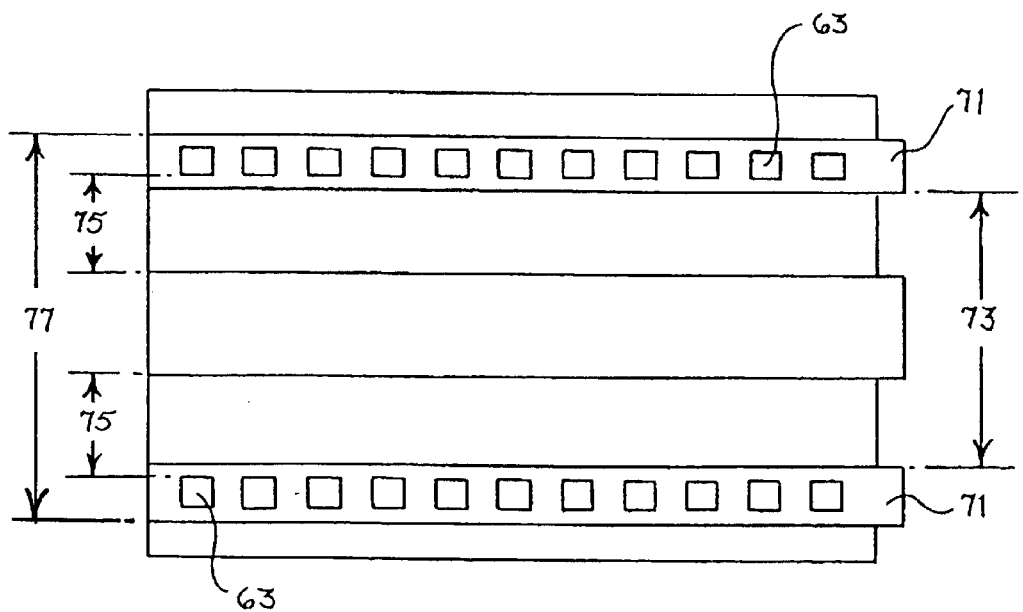
FIG. 13 is top view of a peripheral MOS transistor of the present invention.

As discussed above, forming the peripheral CD contacts on the same mask as the array CB contacts using a selective etching process allows placement of the CD contacts closer to the gate. FIG. 13 shows a top view of a peripheral MOS transistor of the current invention in which the CD contacts 63 have been moved closer to the gate conductor 39. The distance 75 between the CD contacts 63 and the gate conductor 39 has been reduced from 0.14 $\mu$m to 0.075 m, and the distance 73 between the metallization lines 71 has been reduced from 0.38 $\mu$m to 0.25 m. As a result, the overall width of the transistor 77 has been reduced by 0.13 $\mu$m from 0.94 $\mu$m to 0.81 m which represents about a 14% percent decrease in size of the transistor. While the present invention has been discussed in terms of DRAM devices having transistors in 0.14 $\mu$m ground rule, it will be apparent to those skilled in the art that the present invention will be applicable to DRAM devices and other semiconductor devices utilizing transistors having smaller groundrules.

Furthermore, it should be apparent that various modifications in the process described, which is illustrative of one embodiment of the invention may be devised without departing from the scope and spirit of the invention. In particular, changes can be made in the particular metals described or in the dielectrics used. Similarly, other possible changes include the substitution of vapor diffusion for ion implantation in some of the steps.

What is claimed is:

1. A semiconductor device comprising:
   a semiconductor substrate having an array region and a support region;
   at least one gate stack on said array region and said support region, said gate stack comprising a gate conductor, a gate cap, and sidewalls surrounded by gate spacers;
   a first dielectric layer over said at least one gate stack;
   a second dielectric layer over said first dielectric layer;
   first and second contact-to-diffusion openings extending through said second dielectric layer to said semiconductor substrate in said support region,
   wherein said first and second contact-to-diffusion openings comprise contact openings having a substantially continuous vertical wall surface through said first and second dielectric layers;
   at least one borderless array contact extending from said second dielectric layer to a diffusion area in said array region; and
   at least one contact-to-gate opening extending from said second dielectric layer between said first and second contact-to-diffusion openings,
   wherein said first dielectric layer and said second dielectric layer comprise a material chemically reactive with a dielectric etchant, and
   wherein said gate cap and spacers comprises a material that is substantially unreactive with said dielectric etchant.

2. The semiconductor device of claim 1 wherein said gate conductor comprises polysilicon and tungsten suicide.

3. The semiconductor device of claim 1, wherein a distance between said contact-to-diffusion and said gate conductor is less than about 0.075 $\mu$m.

4. The semiconductor device of claim 1, wherein said first dielectric layer and said second dielectric layer comprise silicon oxide and said gate cap and spacers comprise silicon nitride.

5. The semiconductor device of claim 1 further comprising a conductive layer over said second dielectric layer.

6. The semiconductor device of claim 5, wherein said conductive layer is selected from the group consisting of tungsten, aluminum, copper, aluminum-copper alloy, and tantalum.

7. A semiconductor device comprising:
   a semiconductor substrate having an array region and a peripheral region;
   a first gate electrode stack on said array region and a second gate electrode stack on said peripheral region, each of said first and second gate electrode stacks comprising a gate conductor, a gate cap, and sidewall spacers adjacent to said gate conductor;
   a first dielectric layer overlying said first and second gate electrode stacks;
   a second dielectric layer overlying said first dielectric layer;
   first and second contact-to-diffusion openings extending through said first and second dielectric layers to said semiconductor substrate in said peripheral region,
   wherein said first and second contact-to-diffusion openings comprise contact openings having a substantially continuous vertical wall surface through said first and second dielectric layers;
   at least one contact-to-gate opening between said first and second contact-to-diffusion openings and extending though said first and second dielectric layers; and
   at least one borderless array contact extending through said first and second dielectric layers to a diffusion area in said array region.

8. The semiconductor device of claim 7, wherein said first dielectric layer and said second dielectric layer comprise a material chemically reactive with a dielectric etchant, and wherein said gate cap and sidewall spacers comprises a material that is substantially chemically unreactive with said dielectric etchant.

9. The semiconductor device of claim 7, wherein said first dielectric layer and said second dielectric layer comprise silicon oxide and said gate cap and spacers comprise silicon nitride.

* * * * *